United States Patent [19]

Parker

[11] Patent Number: 4,553,043
[45] Date of Patent: Nov. 12, 1985

[54] HIGH SPEED DRIVE CIRCUIT
[75] Inventor: Lanny L. Parker, Mesa, Ariz.
[73] Assignee: Codex Corporation, Mansfield, Mass.
[21] Appl. No.: 479,226
[22] Filed: Mar. 28, 1983
[51] Int. Cl.[4] .................... H03K 17/04; H03K 17/693
[52] U.S. Cl. .................................. 307/270; 307/443; 307/450; 307/581
[58] Field of Search ............... 307/269, 270, 480, 481, 307/443, 449, 450, 475, 577, 581, 584

[56] References Cited

U.S. PATENT DOCUMENTS

| 4,061,933 | 12/1977 | Schroeder et al. | 307/269 X |
| 4,074,148 | 2/1978 | Sato | 307/279 |
| 4,365,172 | 12/1982 | Prater | 307/270 |
| 4,477,735 | 10/1984 | Gollinger et al. | 307/450 X |

Primary Examiner—Stanley D. Miller
Assistant Examiner—D. R. Hudspeth
Attorney, Agent, or Firm—Joe E. Barbee

[57] ABSTRACT

A driver circuit directly couples the clock signal to gate electrodes of pull-up devices to minimize the loading effect on the clock signal. The pull-up devices pull up the output to substantially the positive power supply voltage. The clock signal is coupled to the gate electrodes of the pull-up devices by a transistor whose gate electrode is controlled by a control signal. The control signal also triggers the pull down of the gate electrode of the pull-up devices when it is not desired to couple the clock signal to the gate electrode of the pull-up devices.

5 Claims, 3 Drawing Figures

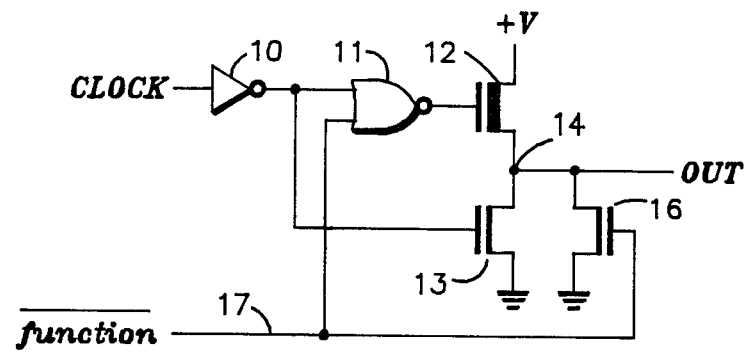
FIG. 1  — PRIOR ART —
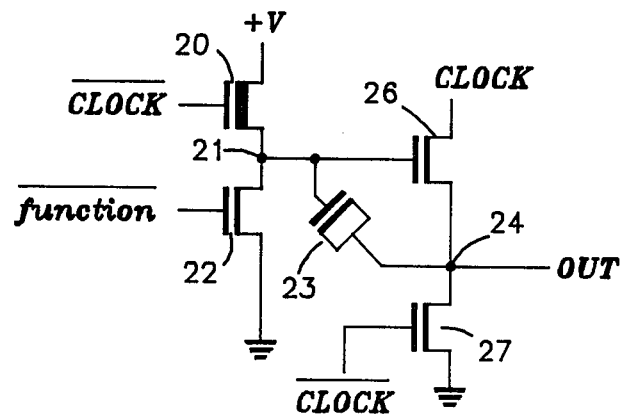
FIG. 2  — PRIOR ART —
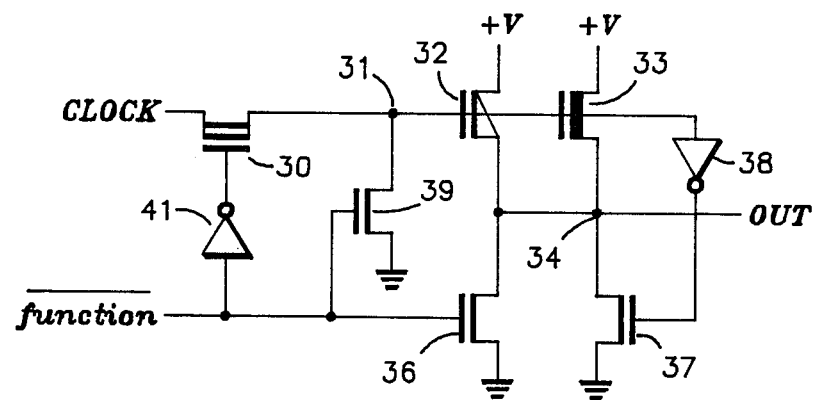
FIG. 3

HIGH SPEED DRIVE CIRCUIT

BACKGROUND ART

This invention relates, in general, to driver circuits, and more particularly, to a high speed drive circuit capable of driving large loads on an integrated circuit.

Driver circuits sometimes called buffer circuits or buffer/drivers are widely used in digital circuits. These circuits serve not only to buffer a signal such as a clock signal from large loads but also serve to drive the large loads. As integrated circuits become more dense and larger in physical size the loads that these drivers must drive also become larger. As an example, in microprocessor designs it is common practice to interconnect an array of registers in a bus structure. This array of registers has inputs to control the logic function performed and has inputs to allow interaction with the bus. The bus is usually placed on metal lines and the register inputs are connected through polysilicon interconnect lines which are commonly called poly lines. Line driver circuits are used to provide the signals on these poly lines. These line drivers should not provide much of a delay to the signal being transferred to the poly lines and the signal being provided must have an amplitude as near the power supply voltage as possible.

Accordingly, it is an object of the present invention to provide an improved driver circuit.

Another object of the present invention is to provide a driver circuit capable of operating at high speeds and providing an output signal having an amplitude substantially equal to the power supply voltage of the circuit.

Yet another object of the present invention is to provide a high speed driver circuit which provides a reduced amount of loading to the signal being processed by the driver circuit.

SUMMARY OF THE INVENTION

The above and other objects and advantages of the present invention are provided by a driver circuit which receives an input signal through a controllable transistor. The input signal drives switching means which are arranged in a manner to provide an output voltage substantially equal to the power supply voltage of the driver circuit. Another transistor is coupled to the clock signal past the controllable transistor and is controlled by a function signal to inhibit an output signal upon command. A complement of the function signal controls the controllable input coupling transistor.

BRIEF DESCRIPTION OF THE DRAWINGS

FIG. 1 illustrates in logic and schematic diagram form a prior art driver circuit;

FIG. 2 illustrates in schematic form another prior art driver circuit; and

FIG. 3 illustrates a driver circuit embodying the present invention.

DETAILED DESCRIPTION OF THE DRAWINGS

FIG. 1 illustrates a prior art circuit wherein an inverter 10 receives a clock signal. Inverter 10 provides an output to a first input of NOR gate 11 and to a gate electrode of an enhancement field effect transistor 13. The output of NOR gate 11 is connected to the gate electrode of a heavy depletion field effect transistor 12. Transistor 12 is coupled between a positive voltage supply (+V) and node 14. Node 14 is coupled to a negative power supply terminal by transistor 13. Transistor 16 is in parallel with transistor 13 and has its gate electrode connected to a function or control signal input 17. Input 17 also goes to a second input for NOR gate 11. The output of the line driver is taken from node 14.

When the control signal on input 17 is a high logic level, transistor 16 will be enabled thereby holding output node 14 low. At the same time the output of NOR gate 11 is being forced to a low logic level thereby reducing the conduction of transistor 12. When the function signal on input 17 is a low logic level, the output appearing at node 14 is pulled high on the leading edge of the clock signal high. The disadvantage to this type of a circuit is a transmission or transfer delay caused by inverter 10 and NOR gate 11 between the clock input signal and the gate electrode of pull-up transistor 12.

FIG. 2 also shows a prior art driver circuit. In this driver circuit a depletion field effect transistor 20 is connected in series with enhancement field effect transistor 22 forming a node 21 therebetween. The gate electrode of transistor 20 receives a $\overline{\text{CLOCK}}$ signal and the gate electrode of transistor 22 receives a function control signal. Node 21 is connected to the gate electrode of enhancement field effect transistor 26 which has its drain electrode connected to a CLOCK terminal and its source connected to node 24. Node 24 also serves as the output for the driver circuit. An enhancement transistor 27 is coupled between output node 24 and a negative power supply terminal. Transistor 27 has its gate electrode connected to $\overline{\text{CLOCK}}$. A bootstrap capacitor 23 is coupled between nodes 21 and 24. One of the advantages of this driver circuit is that the output at node 24 follows the clock signal directly without any transmission or logic gate delays. However, this advantage in speed is negated by the fact that now the circuit which provides a clock signal (CLOCK) must be capable of driving the load connected to node 24 which could be a long poly line and the capacitive loading associated therewith. In the case where the clock signal has to drive a large number of poly lines, it is not practical to integrate a clock circuit large enough to drive such a load.

FIG. 3 illustrates an embodiment of the present invention. The line driver shown in FIG. 3 operates with minimum delay and provides an output voltage which approaches the amplitude of the positive power supply voltage. The clock input signal (CLK) is coupled to node 31 by controllable input transistor 30. Transistor 30 is a lightly doped depletion field effect transistor. Node 31 is connected to the gate electrodes of pull-up transistors 32 and 33. Transistors 32 and 33 are coupled between a positive power supply terminal (+V) and node 34. Node 34 forms the output for the driver circuit. Transistor 32 is a natural type field effect transistor and transistor 33 is a heavily doped depletion field effect transistor. Output node 34 is coupled to the negative power supply terminal, illustrated as ground, by transistors 36 and 37. Transistors 36 and 37 are enhancement type field effect transistors. The gate electrode of transistor 36 is connected to a function control signal. The gate electrode of transistor 37 is connected to the output of an inverter 38. The input of inverter 38 is connected to node 31. Node 31 is coupled to ground by an enhancement type field effect transistor 39. The gate electrode of transistor 39 is connected to the function input signal. The function input signal also goes to the input of an inverter 41 whose output goes to the gate electrode of transistor 30.

When the function signal is at a low logic level, transistors 36 and 39 will not be enabled. The output of inverter 41 will enable transistor 30 so whenever the clock signal is present it will be immediately coupled to node 31 which will enable transistors 32 and 33. The signal at node 31 is inverted by inverter 38 and applied to transistor 37 which will not enable transistor 37. Accordingly, since transistors 32 and 33 are enabled they will pull-up output node 34. Transistor 32 is illustrated as a natural transistor to provide speed in pulling up output node 34. A natural transistor has a lower threshold voltage than a regular enhancement transistor such as transistors 36, 37 and 39. Depletion transistor 33 is a heavily doped depletion transistor and is used to pull output node 34 up to as close to the positive power supply voltage as possible. Controllable input transistor 30 is a lightly doped depletion transistor and is used to provide faster operating speed or faster response time in coupling the clock signal from the input to node 31.

When function signal goes to a high logic level it will be inverted by inverter 41 thereby placing the gate electrode of transistor 30 at essentially ground level. This will greatly reduce the conduction of transistor 30. At the same time the function signal will enable transistors 36 and 39. Transistors 39 will pull node 31 low while transistor 36 will pull output node 34 low. The low logic level at node 31 caused by transistor 39 will be inverted by inverter 38 thereby applying a high logic level to the gate electrode of transistor 37 causing transistor 37 to conduct. Transistor 37 will help transistor 36 to hold output node 34 low. The output of inverter 41 will not go negative far enough to completely shut off depletion type transistor 30. Therefore, transistor 39 will pull a little bit of current through transistor 30 sourced from the clock driver. Transistor 39 is a small device, in a preferred embodiment, and therefore won't provide too great of a load on the clock signal. Of course if transistor 30 were an enhancement type transistor this slight load would not be presented to the clock signal; however, there would then be a sacrifice in speed. The function signal is a control signal which in a microprocessor could be an instruction. It should be noted that inverter 38 and transistor 37 are devices which serve to assist transistor 36 and improve the output low level of node 34.

By now it should be appreciated that there has been provided a high speed driver circuit capable of providing a large output signal. The driver circuit uses a control signal to condition the driver to either accept or reject the clock input signal. The clock input signal drives the pull-up devices which provide the output. One of the advantages of this driver circuit is that the clock signal directly drives the gate electrode of the pull-up devices therefore the capacitance loading on the system clock signal is minimal.

Those persons skilled in the art will recognize that certain modifications to the present invention could be made without departing from the spirit and scope of the invention. As an example, multiple control signals (function) could be used by rearranging the connections of inverter 41 and adding a NOR logic gate. The multiple control signals would each be connected to an input of the NOR gate and the output of the NOR gate would be connected to the input of the inverter and to the gate electrode of transistor 30. The output of the inverter would then be used to drive the gate electrodes of transistors 36 and 39.

Another modification is to change inverter 41 to a dual input NOR logic gate and connect a different control signal to each input of the NOR gate. At the same time, a transistor is added in parallel with transistor 39 and another transistor added in parallel with transistor 36. The gate electrode of these two additonal transistors are driven by the additional control signal.

While yet other modifications would be apparent, it is intended that the claims cover all such modifications and equivalents that come within the spirit and scope of the invention.

I claim:

1. A line driver circuit having an input and an output terminal, comprising: a controllable coupler for coupling an input signal present at the input terminal; a first transistor having a control electrode coupled to the controllable coupler to receive the input signal from the controllable coupler, the first transistor being for coupling voltage from a voltage terminal to the output terminal; a second transistor coupled in parallel with the first transistor and having a control electrode coupled to the controllable coupler to receive the input signal from the controllable coupler, and wherein the first transistor has a lower threshold voltage than the second transistor; and a third transistor coupled to the output terminal for discharging the output terminal and having a control electrode coupled to a control signal input.

2. The line driver circuit of claim 1 further including a fourth transistor coupled between the control electrodes of the first and second transistors and a reference terminal and having a control electrode coupled to the control signal input, and wherein the controllable coupler is transistor controlled by a complement of the control signal appearing at the control signal input.

3. A buffer driver circuit capable of driving long polysilicon lines, comprising: coupling means for controllably coupling a clock signal into the driver circuit; switching means coupled between a power supply terminal and an output for the driver circuit, the switching means having a control input coupled to the coupling means so that the clock signal controllably coupled by the coupling means controls the switching means without intermediate delays between the control input and the clock input to the driver circuit to provide an output signal having substantially zero delay from the clock signal; and inhibiting means coupled to the control input of the switching means to controllably inhibit the switching means, the inhibiting means being controlled by an input signal.

4. The buffer driver of claim 3 wherein the coupling means is a field effect transistor having a control electrode coupled to the input signal by an inverter; and the switching means is a pair of field effect transistors coupled in parallel with their control electrodes coupled to the coupling means to receive the clock signal from the coupling means.

5. The buffer driver of claim 4 wherein the pair of field effect transistors are a natural transistor and a depletion type transistor; and further including a first and a second transistor coupled to the output of the driver circuit, the first transistor being controlled by the input signal and the second transistor being controlled by the clock signal from the coupling means coupled through an inverter.

* * * * *